US012581756B2

(12) United States Patent
Lu et al.

(10) Patent No.: US 12,581,756 B2
(45) Date of Patent: Mar. 17, 2026

(54) IMAGE SENSOR APPROPRIATE FOR MULTIPLE SHOOTING MODES, CAMERA MODULE, ELECTRONIC DEVICE, AND SHOOTING METHOD

(71) Applicant: VIVO MOBILE COMMUNICATION CO., LTD., Dongguan (CN)

(72) Inventors: Peirui Lu, Dongguan (CN); Ziyu Wang, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 45 days.

(21) Appl. No.: 18/676,937

(22) Filed: May 29, 2024

(65) Prior Publication Data

US 2024/0313011 A1      Sep. 19, 2024

Related U.S. Application Data

(63) Continuation of application No. PCT/CN2022/134875, filed on Nov. 29, 2022.

(30) Foreign Application Priority Data

Nov. 30, 2021      (CN) ........................... 202111449511.8

(51) Int. Cl.
| | |
|---|---|
| *H04N 5/335* | (2011.01) |
| *H04N 25/42* | (2023.01) |
| *H10F 39/00* | (2025.01) |
| *H10F 39/18* | (2025.01) |

(52) U.S. Cl.
CPC ......... *H10F 39/8023* (2025.01); *H04N 25/42* (2023.01); *H10F 39/1825* (2025.01); *H10F 39/8063* (2025.01)

(58) Field of Classification Search
CPC ...................................................... H04N 25/17
See application file for complete search history.

(56) References Cited

U.S. PATENT DOCUMENTS

| | | | |
|---|---|---|---|
| 2003/0038296 A1* | 2/2003 | Merrill ................... | H04N 25/17 257/440 |
| 2004/0161868 A1 | 8/2004 | Hong | |
| 2007/0024879 A1 | 2/2007 | Hamilton et al. | |
| 2009/0194799 A1* | 8/2009 | Lee ........................ | H04N 25/17 257/292 |
| 2012/0075511 A1* | 3/2012 | Tay ......................... | H10F 39/18 348/E9.005 |
| 2013/0187027 A1 | 7/2013 | Qiao et al. | |
| 2014/0175591 A1* | 6/2014 | Tian ...................... | H10F 39/813 257/440 |

(Continued)

FOREIGN PATENT DOCUMENTS

| | | |
|---|---|---|
| CN | 101350893 A | 1/2009 |
| CN | 104054327 A | 9/2014 |

(Continued)

*Primary Examiner* — Gary C Vieaux
(74) *Attorney, Agent, or Firm* — The Webb Law Firm

(57) ABSTRACT

An image sensor includes a pixel array, and the pixel array includes a first number of first pixel units and a second number of second pixel units, where the first pixel unit includes photosensitive elements stacked and configured to acquire photo signals of at least two colors. The second pixel unit includes photosensitive elements configured to acquire photo signals of a single color.

20 Claims, 13 Drawing Sheets

(56) References Cited

U.S. PATENT DOCUMENTS

| | | |
|---|---|---|
| 2015/0311242 A1 | 10/2015 | Bai et al. |
| 2017/0126947 A1 | 5/2017 | Hong |
| 2018/0109741 A1 | 4/2018 | Sukegawa et al. |
| 2021/0099629 A1* | 4/2021 | Zhou .................... H04N 25/702 |
| 2022/0367550 A1 | 11/2022 | Wang et al. |

FOREIGN PATENT DOCUMENTS

| | | | |
|---|---|---|---|
| CN | 107534049 | A | 1/2018 |
| CN | 108353134 | A | 7/2018 |
| CN | 108900772 | A | 11/2018 |
| CN | 208548353 | U | 2/2019 |
| CN | 110650301 | A | 1/2020 |
| CN | 111756973 | A | 10/2020 |
| CN | 112331684 | A | 2/2021 |
| CN | 112788320 | A | 5/2021 |
| CN | 113037980 | A | 6/2021 |
| CN | 113038046 | A | 6/2021 |
| CN | 114125240 | A | 3/2022 |
| JP | 2006165037 | A | 6/2006 |

* cited by examiner

101

1011

1012

1013

101　　102

100

102　　　101

IMAGE SENSOR APPROPRIATE FOR MULTIPLE SHOOTING MODES, CAMERA MODULE, ELECTRONIC DEVICE, AND SHOOTING METHOD

CROSS-REFERENCE TO RELATED APPLICATIONS

This application is a Bypass Continuation Application of International Patent Application No. PCT/CN2022/134875, filed on Nov. 29, 2022, and claims priority to Chinese Patent Application No. 202111449511.8, filed Nov. 30, 2021, the disclosures of which are hereby incorporated by reference in their entireties.

BACKGROUND OF THE INVENTION

Field of the Invention

This application pertains to the field of sensor technologies, and relates to an image sensor, a camera module, an electronic device, and a shooting method.

Description of Related Art

In the related art, in order to demonstrate shooting capabilities of an existing smartphone, one mobile phone is equipped with multiple camera modules or lenses for realizing different functions, and each camera module is provided with an image sensor, for example, a 100-megapixel main camera, a 120-degree ultra-wide-angle lens, a 2× portrait zoom, and an ultra-long zoom. However, more camera modules mean increased costs.

SUMMARY OF THE INVENTION

This application provides an image sensor, an electronic device, and a shooting method.

According to a first aspect, an embodiment of this application proposes an image sensor including a pixel array. The pixel array includes a first number of first pixel units and a second number of second pixel units, where the first pixel unit includes photosensitive elements stacked and configured to acquire photo signals of at least two colors, and the second pixel unit includes photosensitive elements configured to acquire photo signals of a single color.

According to a second aspect, an embodiment of this application proposes a camera module including the image sensor as described above.

According to a third aspect, an embodiment of this application proposes an electronic device including the camera module as described above.

According to a fourth aspect, an embodiment of this application proposes a shooting method. The shooting method includes:

acquiring a shooting mode; and controlling, through the first pixel control circuit and the second pixel control circuit, a pixel unit corresponding to the shooting mode to be activated.

DESCRIPTION OF THE INVENTION

Figure 1:
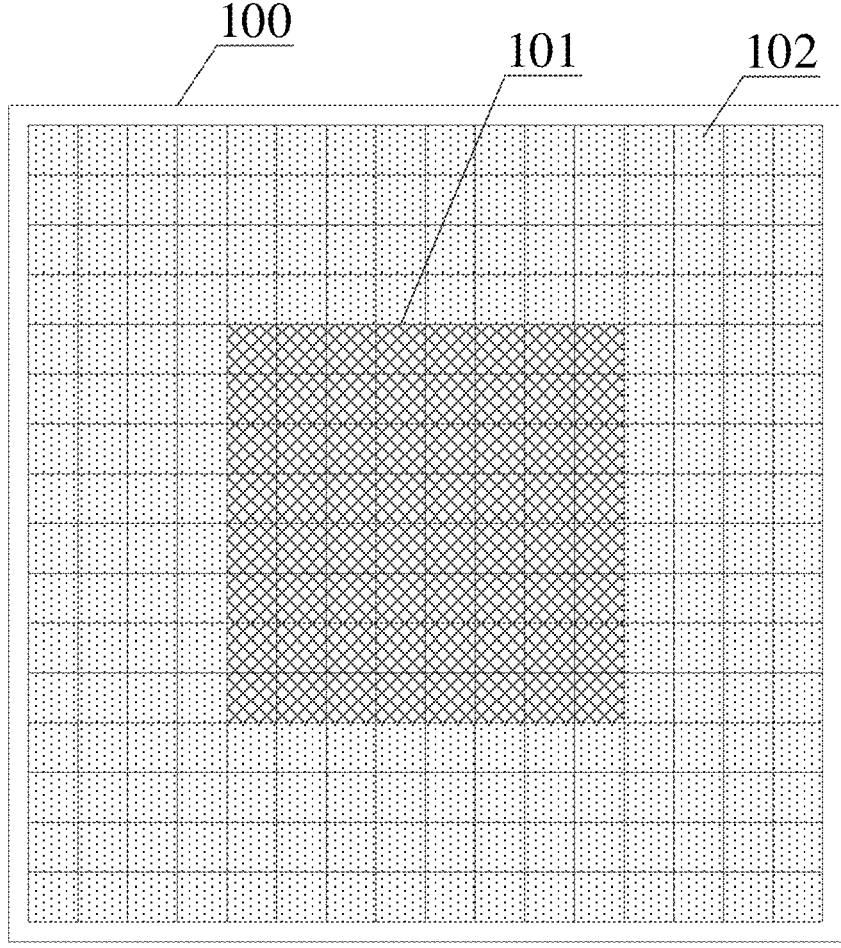
FIG. 1 is a first schematic structural diagram of an image sensor according to an embodiment of this application.

The embodiments of this application are described below. Examples of the embodiments are shown in the accompanying drawings, and the same or similar reference signs indicate the same or similar components or components with the same or similar functions. The embodiments described below with reference to the drawings are exemplary and only used to explain this application, but cannot be understood as a limitation of this application. All other embodiments obtained by persons of ordinary skill in the art based on the embodiments of this application shall fall within the protection scope of this application.

Features defined by terms "first" and "second" in the specification and claims of this application may explicitly or impliedly include one or more such features. In the descriptions of this application, "a plurality of" means two or more, unless otherwise specified. In addition, the term "and/or" in the specification and claims indicates at least one of connected objects, and the character "/" generally represents an "or" relationship between associated objects.

In the description of this application, it should be noted that orientations or positional relationships indicated by the terms such as "center" is an orientation or positional relationship shown in the accompanying drawings, and are merely for the convenience of describing this application and simplifying the description, rather than indicating or implying that the devices or elements must have a particular orientation, and constructed and operated in the particular orientation. Therefore, it cannot be construed as a limitation to this application.

In the description of this application, it needs to be noted that, unless otherwise expressly provided and limited, the terms "mounting", "joint", and "connection" should be understood in a broad sense. For example, "connection" may be a fixed, removable, or integral connection, a mechanical connection, an electrical connection, a direct connection, an indirect connection through an intermediary medium, or a connection within two elements. Persons of ordinary skill in the art can understand specific meanings of these terms in this application based on specific situations.

For some mobile phones that pursue cost-effectiveness, one mobile phone cannot have too many camera modules installed. To meet the needs of consumers, some functions are realized through only software, for example, a 2× focal length mode called a portrait mode. To achieve this function with no 2× optical portrait lens equipped, there are two ways in which this function can be implemented through software. One way is to zoom in and crop a high-resolution photo that has been imaged to get a photo that is different from the ordinary field of view. The other way is to use a four-in-one sensor and then use some pixels (pixel) in the center for photosensitive interpolation output. Although the number of pixels is increased by four times, it also means that the area of a single pixel will be smaller and the pixel size becomes smaller. Consequently, the photosensitivity of the sensor is reduced, the dynamic range is reduced, and photo quality deteriorates due to noise when the mobile phone is used in dark environments.

In the related art, one image sensor cannot be appropriate for multiple shooting modes. In addition, images obtained after software processing of captured images will have problems such as poor image definition and false colors, resulting in poor image quality.

An image sensor, a camera module, an electronic device, and a shooting method provided in the embodiments of this application are hereinafter described through some embodiments and application scenarios thereof with reference to the accompanying drawings.

As shown in FIG. 1, in an image sensor according to an embodiment of this application, the image sensor 100 includes a pixel array, and the pixel array includes a first number of first pixel units 101 and a second number of second pixel units 102, where the first pixel unit 101 includes photosensitive elements stacked and configured to acquire photo signals of at least two colors, and the second pixel unit 102 includes photosensitive elements configured to acquire photo signals of a single color.

The second pixel unit 102 includes a microlens, a color filter, a photodiode, and the like, and each second pixel unit 102 can acquire photo signals of a single color. In an implementation, the second pixel unit 102 can be divided into a second pixel unit configured to acquire photo signals of a blue waveband, a second pixel unit configured to acquire photo signals of a green waveband, and a second pixel unit configured to acquire photo signals of a red waveband, where the second pixel unit may be denoted as an RGB pixel.

Figure 2:
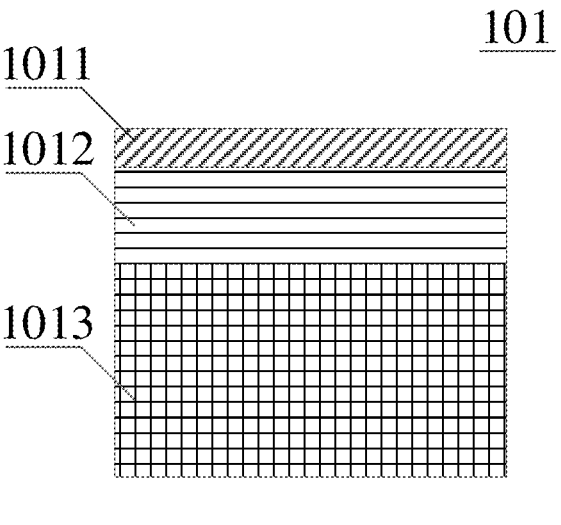
FIG. 2 is a schematic structural diagram of a first pixel unit according to an embodiment of this application.

The first pixel unit 101 can simultaneously acquire photo signals of a variety of colors through multiple photosensitive elements arranged in a stacked structure. In an implementation, as shown in FIG. 2, the first pixel unit 101 includes a first photosensitive element 1011, a second photosensitive element 1012, and a third photosensitive element 1013 that are stacked, where the first photosensitive element 1011 is configured to acquire photo signals of a blue waveband, the second photosensitive element 1012 is configured to acquire photo signals of a green waveband, and the third photosensitive element 1013 is configured to acquire photo signals of a red waveband. The principle that different wavelengths of visible light have different penetrabilities is used such that the first pixel unit 101 can acquire photo signals of three different wavelengths. In this case, the first pixel unit 101 can be denoted as an X3 pixel. The first pixel unit 101 can hold more pixels in a limited space, which can effectively solve problems such as imaging false colors under high pixels.

Optionally, a ratio of the first number of first pixel units to the second number of second pixel units in the pixel array may be set depending on actual needs. In an implementation, the ratio of the first number to the second number is 1:1 to 3:1.

The image sensor further includes a control circuit. The control circuit controls working states of the first pixel units 101 and the second pixel units 102, such that a pixel unit can work by controlling the pixel unit to be activated and the pixel unit cannot work by controlling the pixel unit to be deactivated. In an implementation, activation and deactivation of a corresponding pixel unit can be controlled by controlling a switch of a row-column selector.

Figure 3:
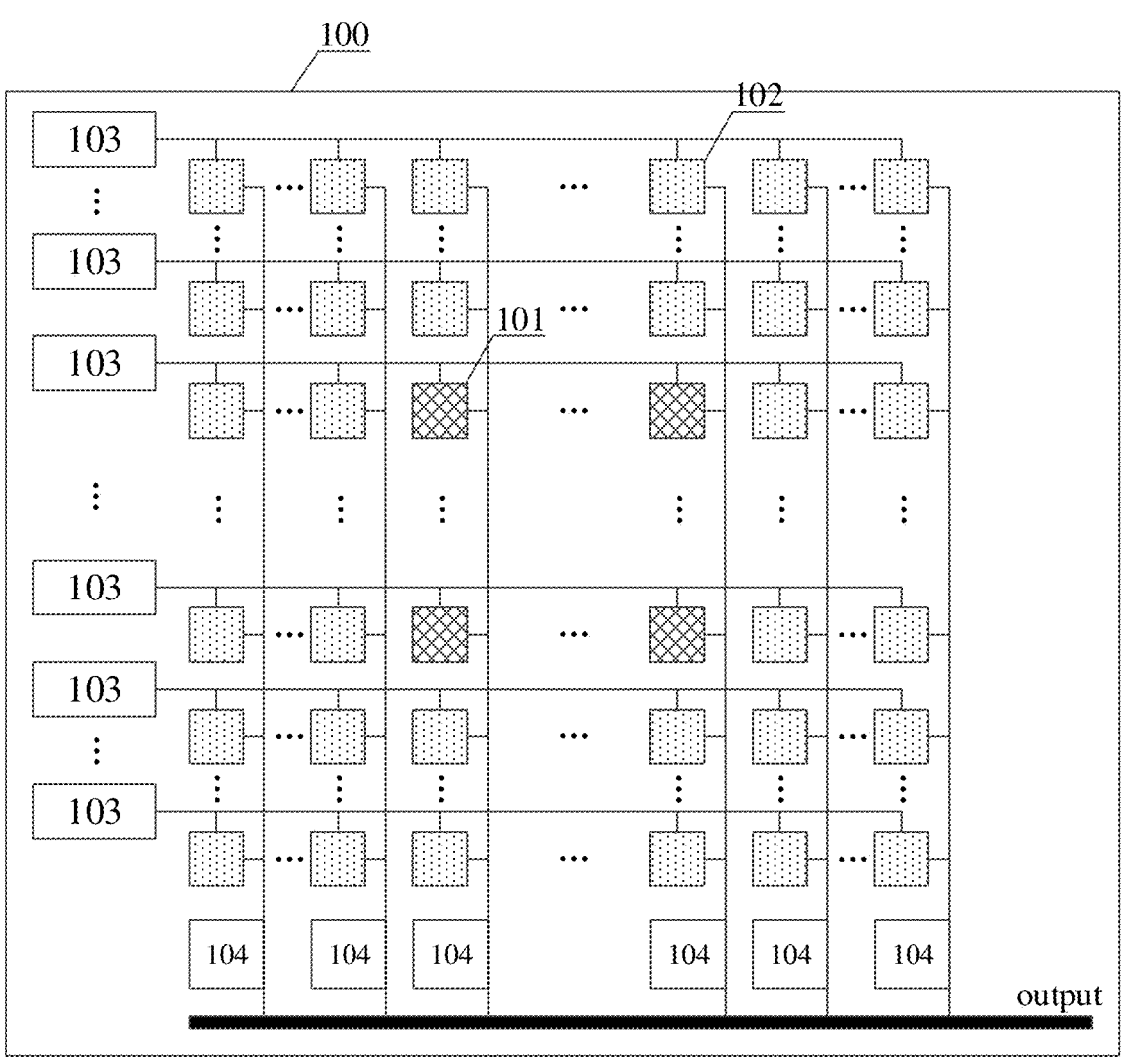
FIG. 3 is a second schematic structural diagram of an image sensor according to an embodiment of this application.
Figure 4:
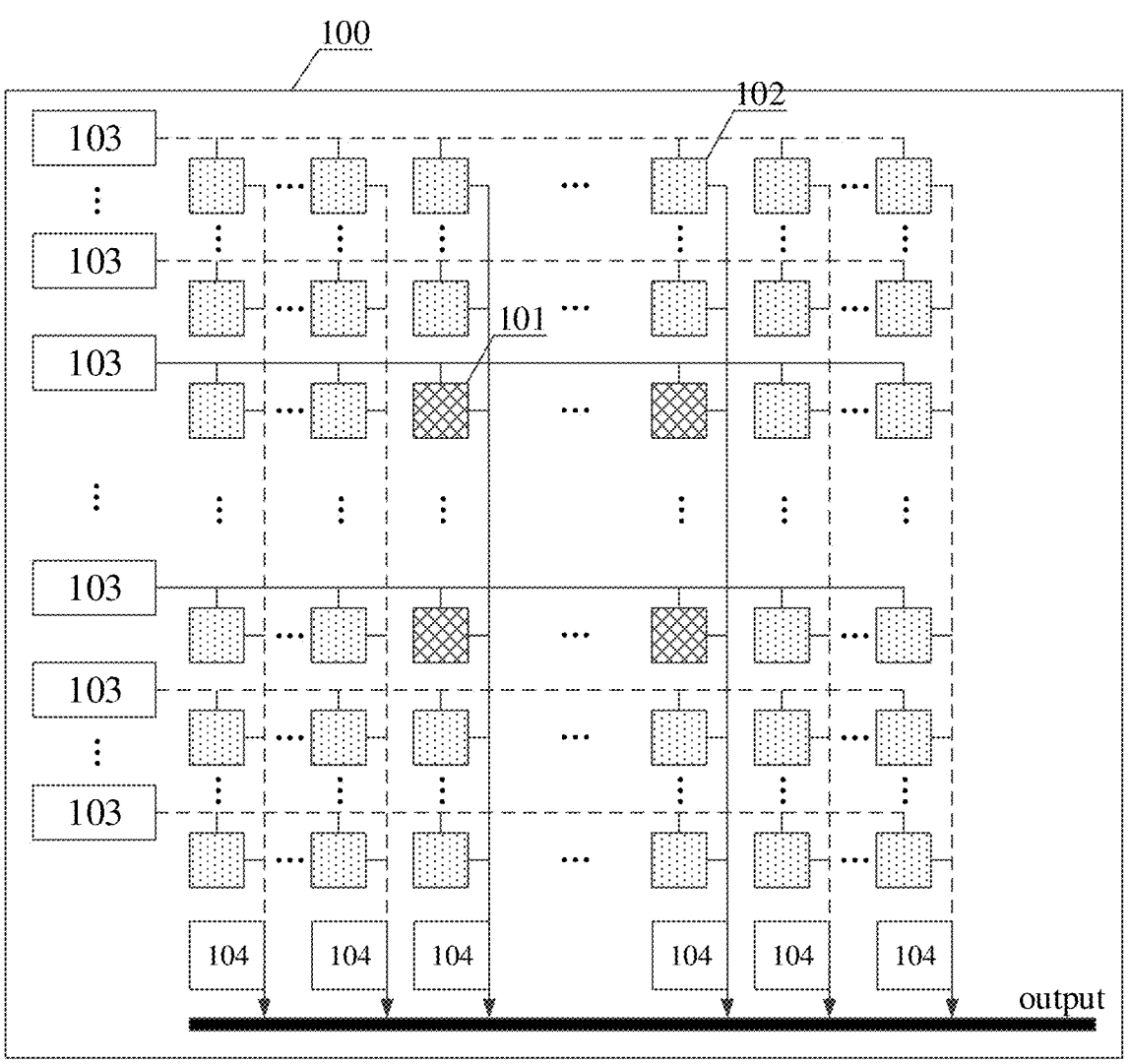
FIG. 4 is a third schematic structural diagram of an image sensor according to an embodiment of this application.

As shown in FIG. 3 and FIG. 4, with solid lines as activation and dashed lines as deactivation, in FIG. 3, all first pixel units 101 an second pixel units 102 in the pixel array are activated; and in FIG. 4, the first pixel units 101 located in a central region are activated and the second pixel units 102 located in an edge region are deactivated. An activated pixel unit works, and after an output photo signal passes through a signal amplifier and an analog-to-digital conversion circuit 104, an image is output. The output image is then subjected to image signal processing (ISP), for example, white balance processing and gamma processing, to output a final image.

To realize multiple shooting modes with one image sensor, pixel units in the pixel array can be grouped, and the control circuit can control the grouping of the pixel units based on an acquired shooting mode, to activate pixel units in a pixel unit group corresponding to the shooting mode and deactivate pixel units in other pixel unit groups, so as to make the working state of the image sensor meet the requirements of the current shooting mode.

The method of grouping the pixel units in the pixel array may be set depending on actual needs, and the pixel units may be grouped, based on regions, into multiple pixel unit groups corresponding to the regions, or may be grouped based on types of the pixel units.

In an implementation, the pixel units are grouped, based on the first pixel units and the second pixel units, into a first pixel unit group and a second pixel unit group. After shooting starts, a shooting mode is acquired; pixel units in a pixel unit group corresponding to the shooting mode are activated by the control circuit; and the acquired photo signal is output.

The control modes of the control circuit may be set depending on actual needs, and only one example of these control modes is given in this embodiment of this application.

In an implementation, the control modes may include at least one of the following:

in a case that the shooting mode is a first shooting mode, controlling both first pixel units in the first pixel unit group and second pixel units in the second pixel unit group to be activated;

in a case that the shooting mode is a second shooting mode, controlling first pixel units in the first pixel unit group to be activated and controlling second pixel units in the second pixel unit group to be deactivated; or

in a case that the shooting mode is a third shooting mode, controlling second pixel units in the second pixel unit group to be activated and controlling first pixel units in the first pixel unit group to be deactivated.

The first shooting mode, the second shooting mode, and the third shooting mode may be set depending on actual needs, and may correspond to a preset shooting mode, such as a wide-angle mode, or may correspond to a type of preset shooting modes, such as a zoom mode of various magnifications, or may be other modes other than the wide-angle mode and the zoom mode.

In another implementation, the image sensor may include:
a first pixel control circuit, where the first pixel control circuit is connected to the first pixel unit, and the first pixel control circuit is configured to control activation and deactivation of at least one of the first pixel units; and
a second pixel control circuit, where the second pixel control circuit is connected to the second pixel unit, and the second pixel control circuit is configured to control activation and deactivation of at least one of the second pixel units.

The control circuit is divided into the first pixel control circuit and the second pixel control circuit, where the first pixel control circuit controls activation and deactivation of first pixel units in the first pixel unit group, and the second pixel control circuit controls activation and deactivation of second pixel units in the second pixel unit group. In this way, it is more convenient to flexibly control activation and deactivation of the two types of pixel units.

After shooting starts, a shooting mode is acquired, a pixel unit corresponding to the shooting mode is controlled, through the first pixel control circuit and the second pixel control circuit, to be activated.

The control modes of the first pixel control circuit and the second pixel control circuit may be set depending on actual needs. In an implementation, the control modes may include at least one of the following:
in a case that the shooting mode is a first shooting mode, controlling, through the first pixel control circuit and the second pixel control circuit, both the first number of first pixel units and the second number of second pixel units to be activated;
in a case that the shooting mode is a second shooting mode, controlling, through the first pixel control circuit, the first number of first pixel units to be activated, and controlling, through the second pixel control circuit, the second number of second pixel units to be deactivated; or
in a case that the shooting mode is a third shooting mode, controlling, through the second pixel control circuit, the second number of second pixel units to be activated, and controlling, through the first pixel control circuit, the first number of first pixel units to be deactivated.

To adapt to a variety of shooting modes, various arrangements of the first pixel units and second pixel units in the pixel array are set. Only several examples of these arrangements are given in this embodiment of this application.

Figure 5:
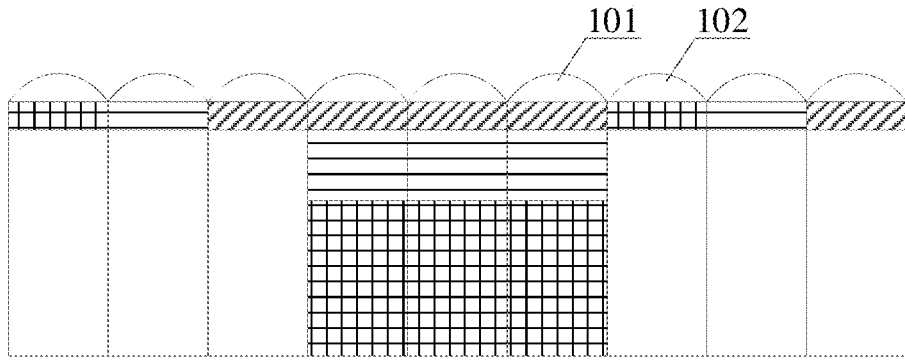
FIG. 5 is a cross-sectional view of a pixel array according to an embodiment of this application.

In an implementation, as shown in FIG. 1 and FIG. 5, the first number of first pixel units 101 are arranged in a central region of the pixel array and the second number of second pixel units 102 are arranged in an edge region of the pixel array.

The image sensor is applicable to a wide-angle mode and a zoom mode. The first shooting mode is set to the wide-angle mode and the second shooting mode is set to the zoom mode.

The wide-angle mode can be used for shooting landscapes. In this mode, it is necessary to allow the entire shooting scene to be shot as much as possible.

During shooting of some portraits, the zoom mode can be used and a zoom ratio can be adjusted. The zoom imaging has the characteristics of "spatial compression", and the so-called spatial compression means compressing the depth of field, enlarging the distant view, changing the spatial positional relationship between sceneries at different distances, and allowing various elements in the picture to be combined. During shooting of outdoor portraits, the zoom mode can give the viewer a sense that the scenery and people are "not far from each other" through this characteristic, thereby making the picture appear compact and full, and obtaining photos that are more in line with human vision. In addition, the characters and background present a virtual and real effect. The zoom mode can also be used to take partial close-up shots.

During shooting, if it is determined that the shooting mode is a wide-angle mode, all the first pixel units and all the second pixel units in the pixel array are controlled to be activated to acquire photo signals and output them, so as to capture a landscape photo with more details and a larger field of view at one time; or
if it is determined that the shooting mode is a zoom mode, the first pixel units located in the central region of the pixel array are controlled to be activated while the second pixel units located in the edge region are controlled to be deactivated, and the characteristics of the first pixel units are used to capture a low crosstalk and high resolution image so as to achieve a better zoom effect.

Figure 6:
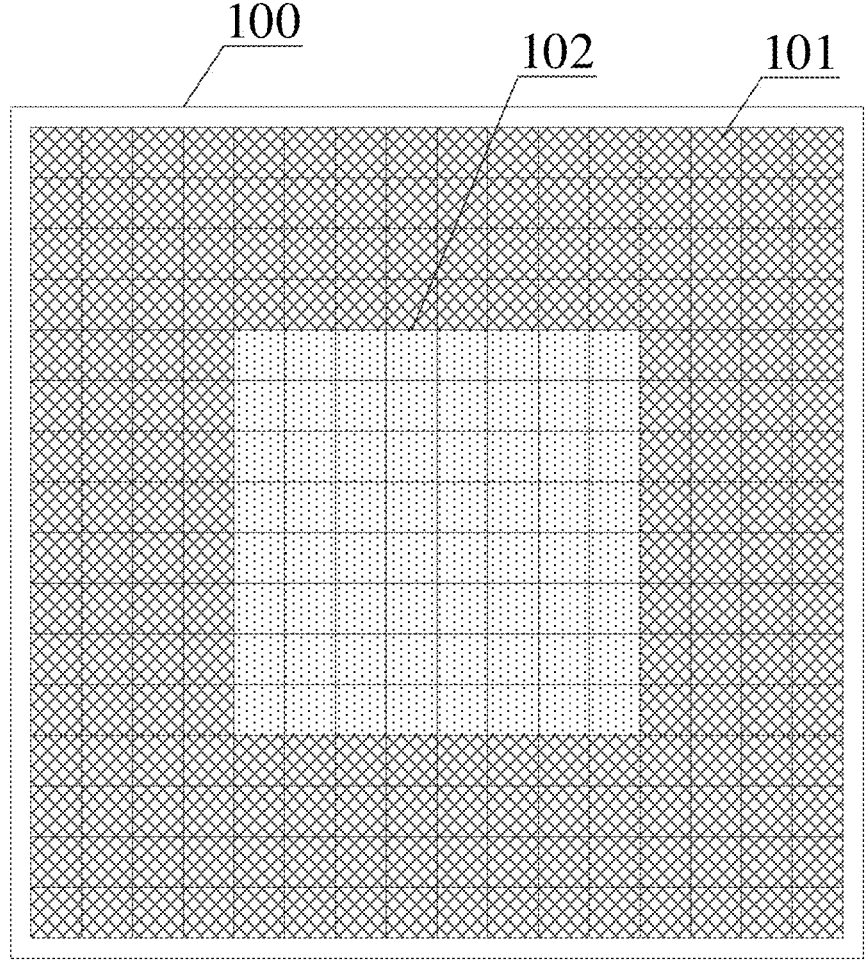
FIG. 6 is a fourth schematic structural diagram of an image sensor according to an embodiment of this application.

In another implementation, as shown in FIG. 6, the first number of first pixel units 101 are arranged in an edge region of the pixel array and the second number of second pixel units 102 are arranged in a central region of the pixel array.

The image sensor can also be applicable to a wide-angle mode and a zoom mode. The first shooting mode is set to the wide-angle mode and the third shooting mode is set to the zoom mode.

The second pixel units located in the edge region tend to cause false colors at the edges of the image. Therefore, the false colors at the edges can be effectively ameliorated by arranging the first pixel units in the edge region during shooting in the wide-angle mode.

During shooting, if it is determined that the shooting mode is a wide-angle mode, all the first pixel units and all the second pixel units in the pixel array are controlled to be activated; or
if it is determined that the shooting mode is a zoom mode, the second pixel units located in the central region of the pixel array are controlled to be activated while the first pixel units located in the edge region are controlled to be deactivated.

Figure 7:
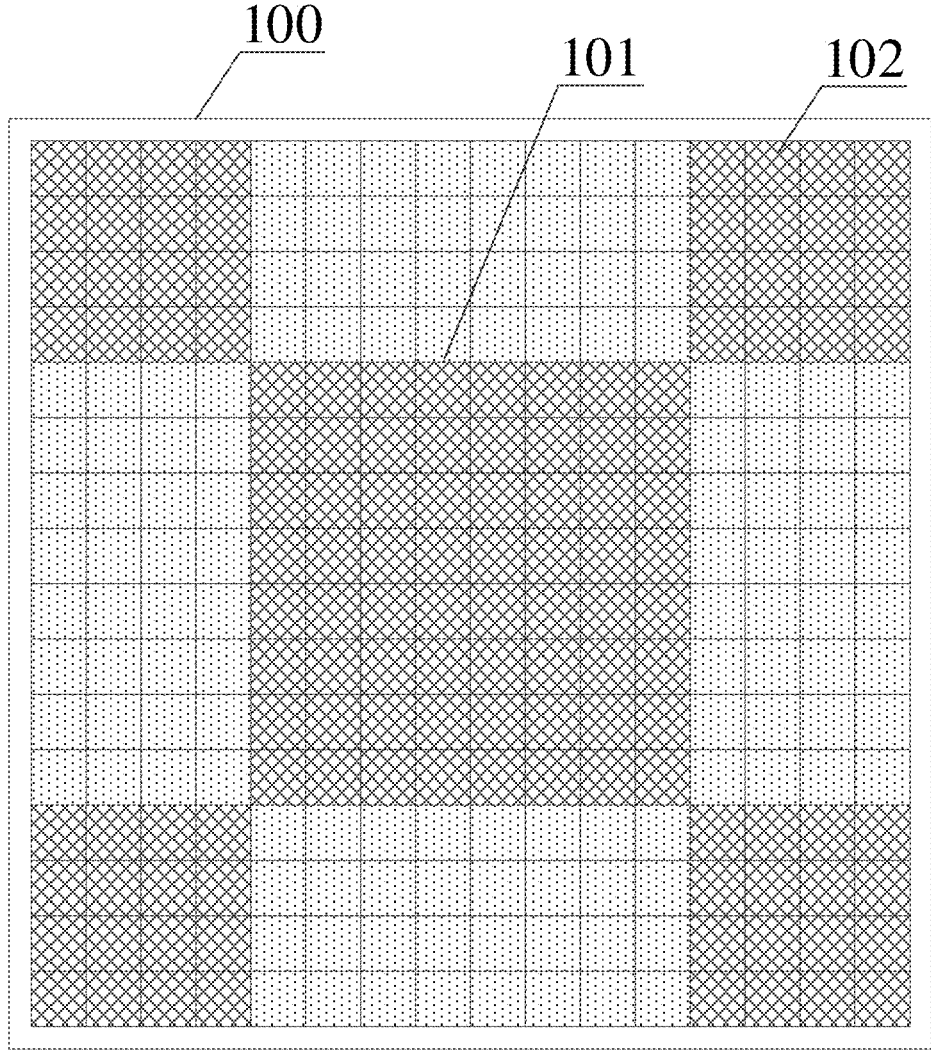
FIG. 7 is a fifth schematic structural diagram of an image sensor according to an embodiment of this application.

In another implementation, the first pixel units may be arranged in the central region of the pixel array, and the first pixel units and the second pixel units may be arranged in the edge region of the pixel array in a spaced manner, where the spaced manner may be in a form of group spacing. This embodiment of this application provides only one implementation, as shown in FIG. 7. The first number of first pixel units 101 are arranged in a central region and four edge sub-regions in an edge region of the pixel array, and the second number of second pixel units 102 are arranged in a predetermined sub-region in the edge region, where the predetermined sub-region is a region in the edge region other than the four edge sub-regions.

Because edges of a captured image are more likely to be blurred than the center, the clarity of the image will be deteriorated if the edge region is zoomed. For this reason, the first pixel units can be arranged in part of the edge region so as to effectively improve the picture quality of the image in the corresponding region. For example, in a meeting, if there is a person standing at an edge of the image and the person is giving a speech, the image sensor may control the first pixel unit located in the edge region to be activated to take a zoom shot of the edge region so as to improve the image quality and reduce power consumed.

The image sensor, in addition to being applicable to the wide-angle mode and the zoom mode, may also be applicable to the zoom shooting mode for an edge region in a preview image. When a user is interested in an object located in an edge region in a preview image, the user can select the region where the object is located and use the first pixel units corresponding to the region where the object is located to achieve zoom shooting of the region where the object is located. The first shooting mode is set to a wide-angle mode, and the second shooting mode is set to a zoom mode and a zoom shooting mode for an edge region in a preview image.

During shooting, if it is determined that the shooting mode is a wide-angle mode, all the first pixel units and all the second pixel units in the pixel array are controlled to be activated to acquire photo signals and output images; or if it is determined that the shooting mode is a zoom mode or a zoom shooting mode for an edge region in a preview image, the first pixel units in the pixel array are controlled to be activated, or only the first pixel units located in the edge region are controlled to be activated, and the characteristics of the first pixel units are used to capture a low crosstalk and high resolution image so as to achieve a better zoom effect.

In another implementation, the pixel array includes multiple pixel groups arranged in a matrix, and the pixel group includes at least one red pixel unit 1023, at least one green pixel unit 1022, at least one blue pixel unit 1021, and one first pixel unit 101; where the second number of second pixel units include the red pixel unit 1023, the green pixel unit 1022, and the blue pixel unit 1021.

In some complex scenes, such as backlighting scenes, signals acquired by the second pixel units are prone to crosstalk, and with the spaced first pixel units, signals or images acquired by the first pixel units can be used as references for signals or images acquired by the second pixel units for enhancing the accuracy of colors of the images.

The image sensor may be applicable to a variety of resolutions or some shooting modes in complex scenes by setting the first shooting mode to a shooting mode at a first resolution or a shooting mode in a complex scene, setting the second shooting mode to a shooting mode at a second resolution, and setting the third shooting mode to a shooting mode at a third resolution, where the first resolution is the highest and the third resolution is the lowest.

During shooting, if it is determined that the shooting mode is a shooting mode at a first resolution or a shooting mode in a complex scene, all the first pixel units and all the second pixel units in the pixel array are controlled to be activated;

if it is determined that the shooting mode is a shooting mode at a second resolution, all the first pixel units in the pixel array are controlled to be activated and all the second pixel units in the pixel array are controlled to be deactivated; or if it is determined that the shooting mode is a shooting mode at a second resolution, all the second pixel units in the pixel array are controlled to be activated and all the first pixel units in the pixel array are controlled to be deactivated.

It should be understood that the number and arrangement of various types of pixel units in each pixel group 110 arranged in a matrix can be set depending on actual needs, and this embodiment of this application gives only some of these implementations.

Figure 8:
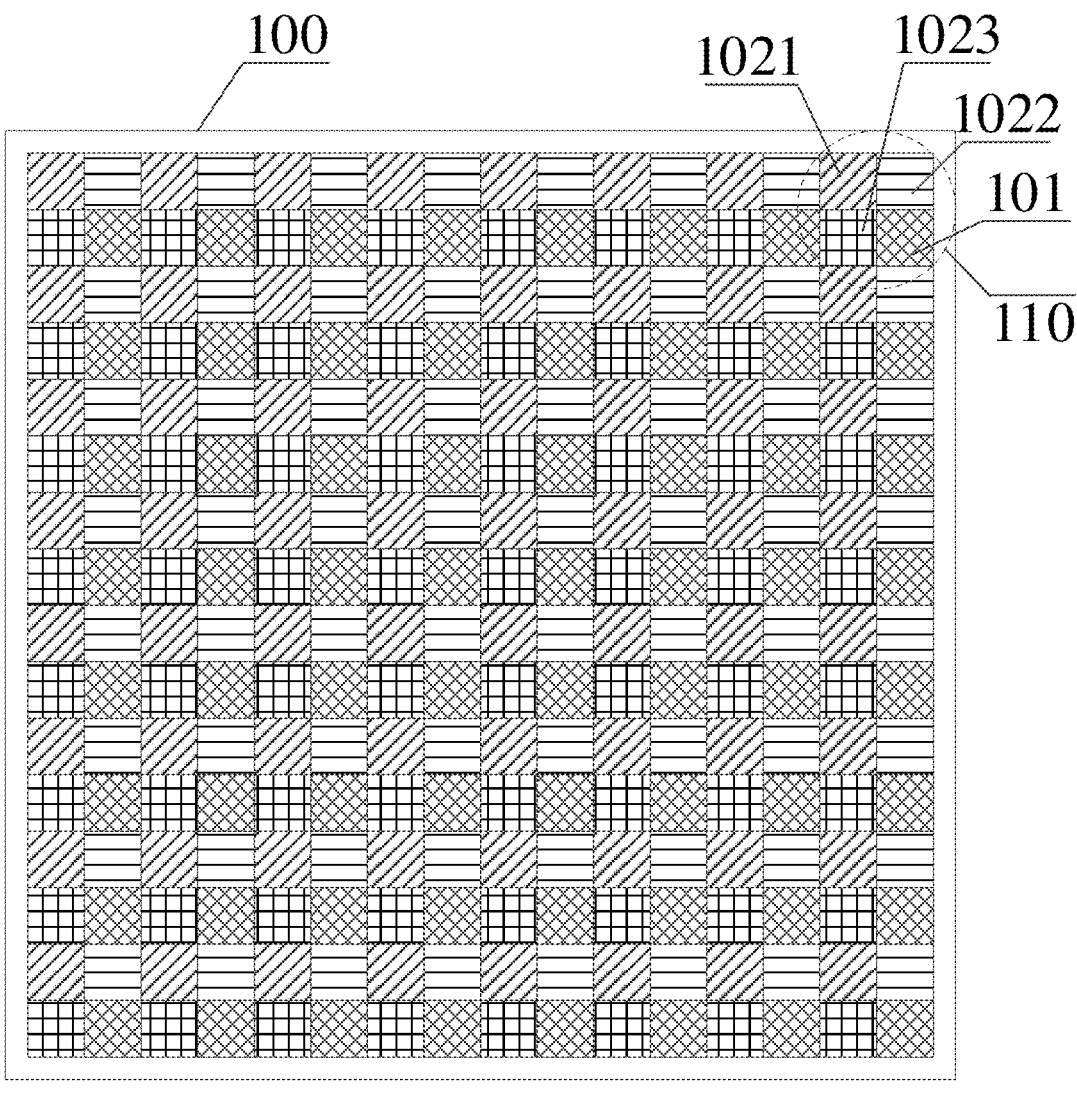
FIG. 8 is a sixth schematic structural diagram of an image sensor according to an embodiment of this application.
Figure 9:
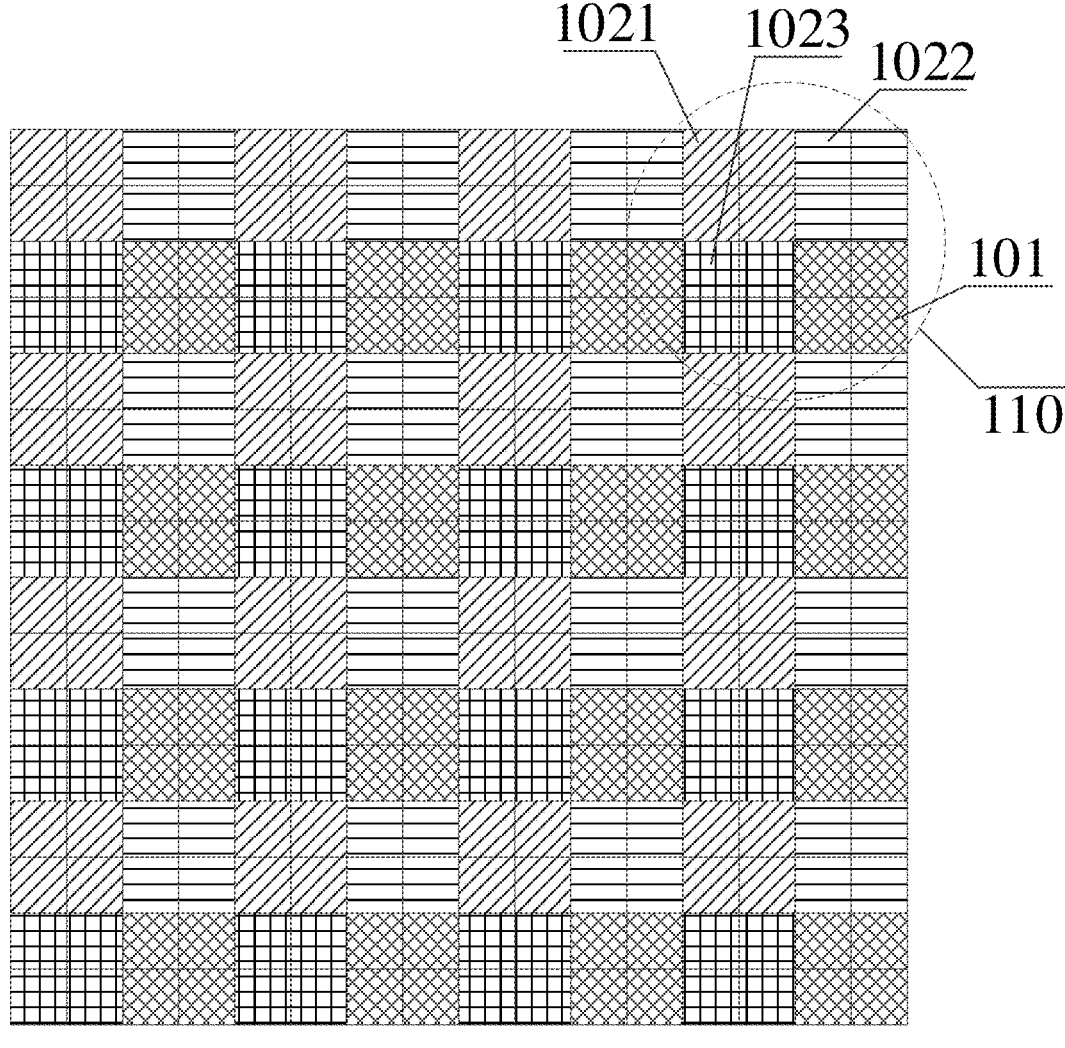
FIG. 9 is a seventh schematic structural diagram of an image sensor according to an embodiment of this application.

In an implementation, the pixel group 110 includes red pixel units 1023, green pixel units 1022, blue pixel units 1021, and first pixel units 101 that have the same numbers. As shown in FIG. 8, each pixel group 110 includes one red pixel unit 1023, one green pixel unit 1022, one blue pixel unit 1021, and one first pixel unit 101. As shown in FIG. 9, each pixel group includes four red pixel units 1023, four green pixel units 1022, four blue pixel units 1021, and four first pixel units 101, where pixel units of the same type form a pixel subgroup.

Figure 10:
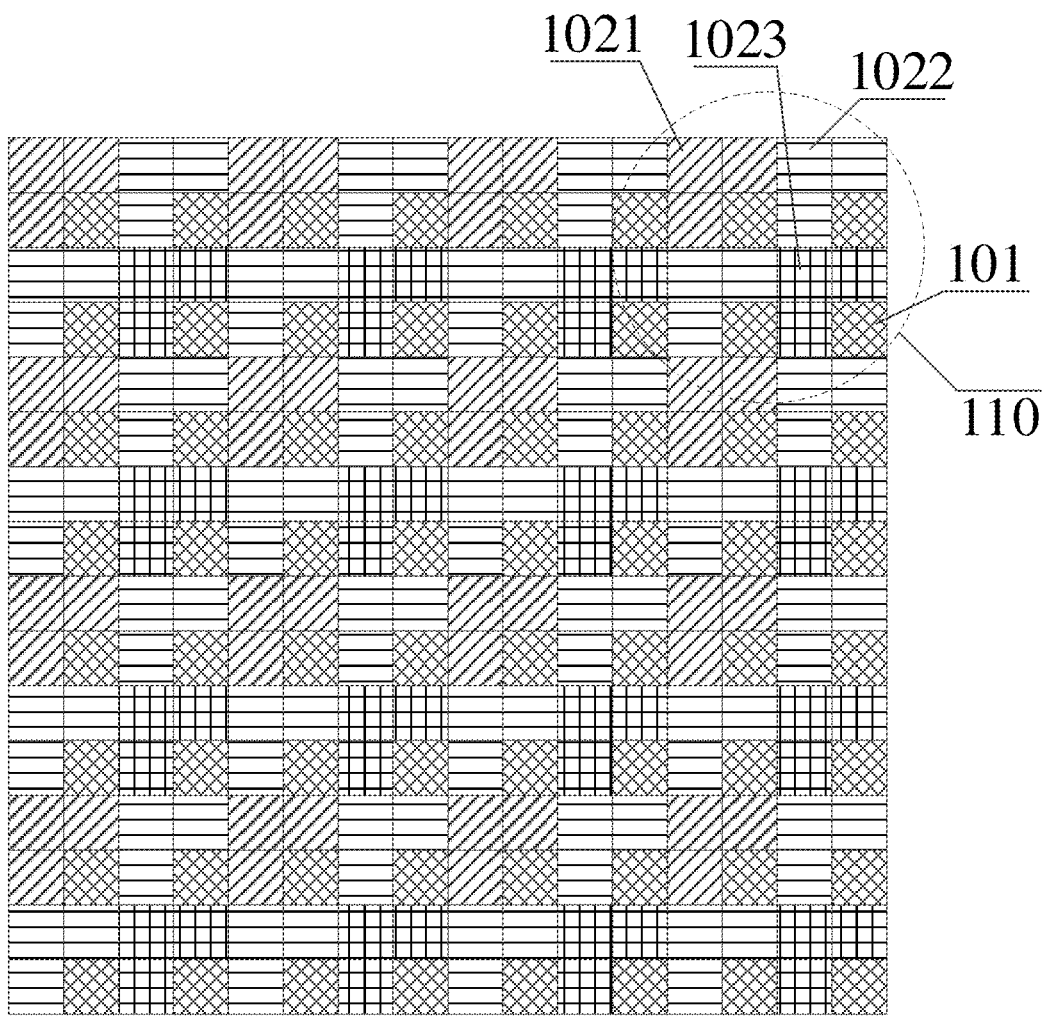
FIG. 10 is an eighth schematic structural diagram of an image sensor according to an embodiment of this application.

In another implementation, each pixel group 110 may include four pixel subgroups, and each subgroup includes a second pixel unit and a first pixel unit that are of one color. A first pixel subgroup includes at least one red pixel unit 1023 and at least one first pixel unit 101, a second pixel subgroup includes at least one green pixel unit 1022 and at least one first pixel unit 101, and a third pixel subgroup includes at least one blue pixel unit 1021 and at least one first pixel unit 101. In an implementation, each pixel group 110 may include one first pixel subgroup, two second pixel subgroups, and one third pixel subgroup. Examples are provided below:

As shown in FIG. 10, the first pixel subgroup includes three red pixel units 1023 and one first pixel unit 101, the second pixel subgroup includes three green pixel units 1022 and one first pixel unit 101, and the third pixel subgroup includes three blue pixel units 1021 and one first pixel unit 101.

Figure 11:
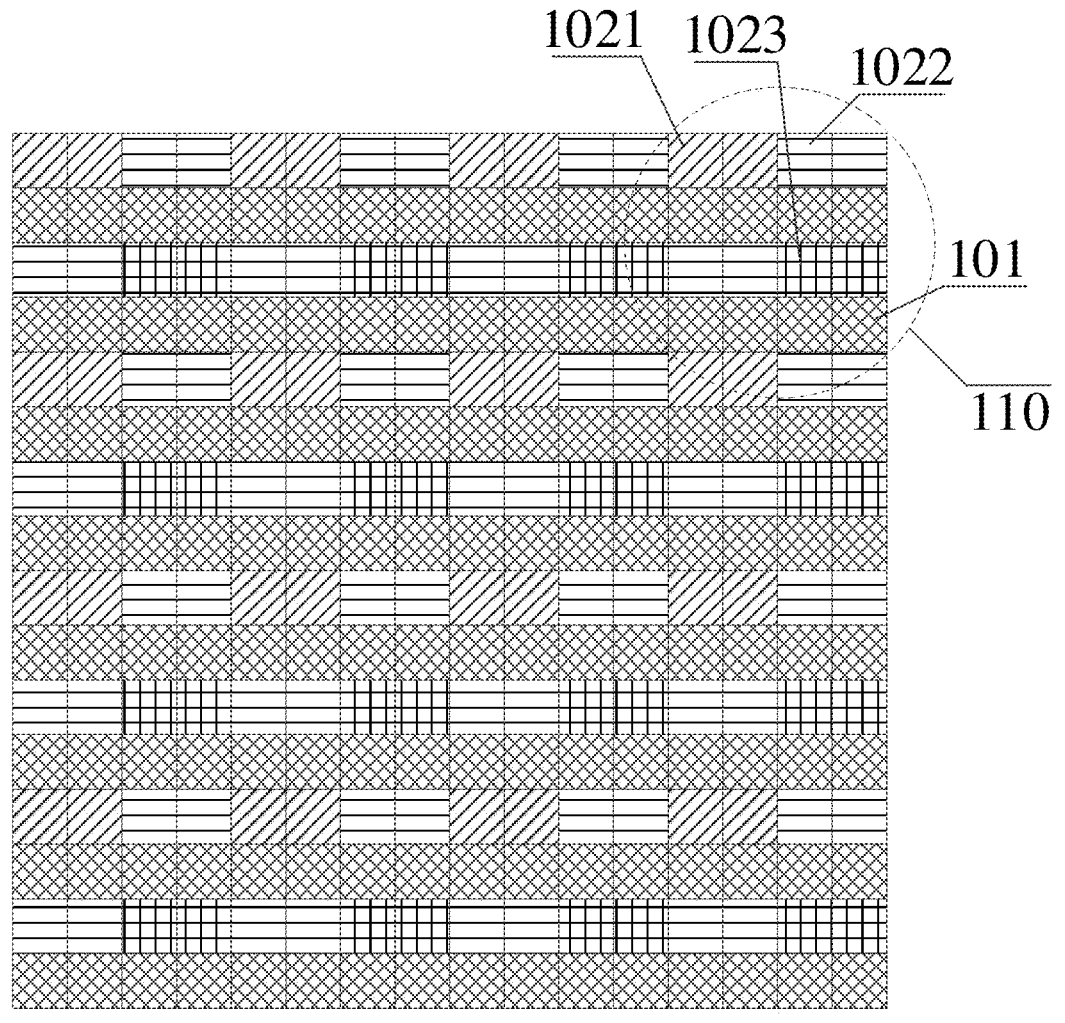
FIG. 11 is a ninth schematic structural diagram of an image sensor according to an embodiment of this application.

As shown in FIG. 11, the first pixel subgroup includes two red pixel units 1023 and two first pixel units 101, the second pixel subgroup includes two green pixel units 1022 and two first pixel units 101, and the third pixel subgroup includes two blue pixel units 1021 and two first pixel units 101.

Figure 12:
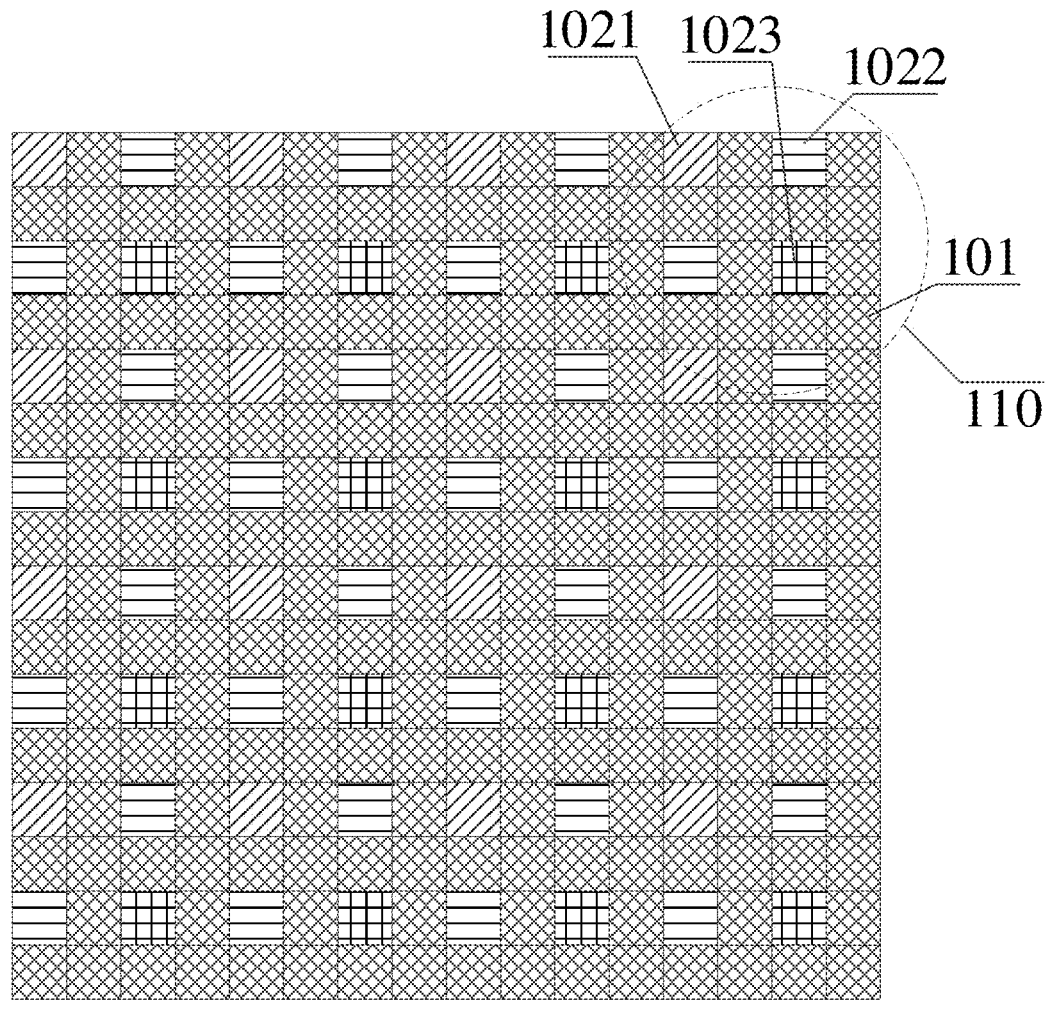
FIG. 12 is a tenth schematic structural diagram of an image sensor according to an embodiment of this application.

As shown in FIG. 12, the first pixel subgroup includes one red pixel unit 1023 and three first pixel units 101, the second pixel subgroup includes one green pixel unit 1022 and three first pixel units 101, and the third pixel subgroup includes one blue pixel unit 1021 and three first pixel units 101.

It can be seen from the technical scheme of the foregoing embodiment that the image sensor according to this embodiment of this application includes a pixel array, and the pixel array includes a first number of first pixel units and a second number of second pixel units, where the first pixel unit includes photosensitive elements stacked and configured to acquire photo signals of at least two colors, and the second pixel unit includes photosensitive elements configured to acquire photo signals of a single color. Working states of the first pixel units and the second pixel units in the pixel array are separately controlled, such that the image sensor can be applicable to a variety of shooting modes to obtain better digital zoom effects and higher-quality images, and to reduce the number of camera modules to be provided on the same electronic device, thereby reducing costs.

Based on the foregoing embodiment, an embodiment of this application further provides a camera module, where the camera module includes an image sensor as described above.

Optionally, the camera module further includes:

a circuit board, where the image sensor is electrically connected to the circuit board; and a lens, where the lens is arranged on a side of the image sensor away from the circuit board; or multiple lenses may be arranged.

In the camera module provided in this embodiment of this application, working states of the first pixel units and the second pixel units in the pixel array are separately controlled to obtain better digital zoom effects and higher-quality images, and to reduce the number of camera modules to be provided on the same electronic device, thereby reducing costs.

Figure 13:
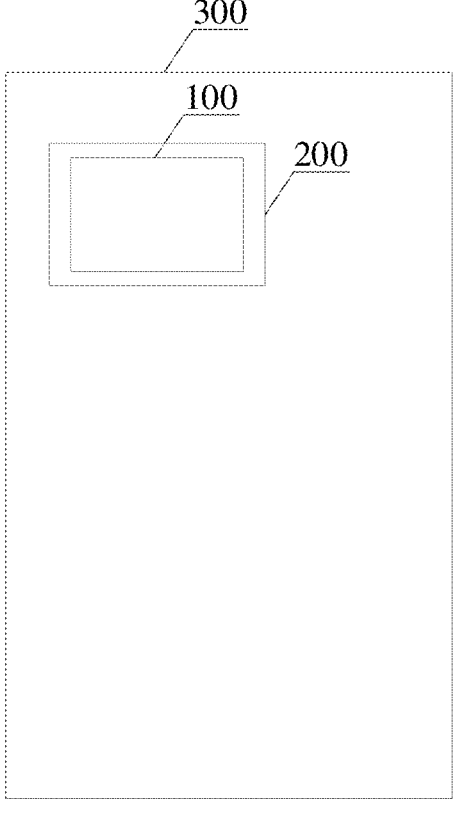
FIG. 13 is a schematic structural diagram of an electronic device according to an embodiment of this application.

Based on the foregoing embodiments, optionally, as shown in FIG. 13, an embodiment of this application further provides an electronic device 300, where the electronic device includes the camera module 200 as described above, and the camera module 200 includes the image sensor 100 as described above.

In the electronic device provided in this embodiment of this application, working states of the first pixel units and the second pixel units in the pixel array are separately controlled to obtain better digital zoom effects and higher-quality images, and to reduce the number of camera modules to be provided on the same electronic device, thereby reducing costs.

Figure 14:
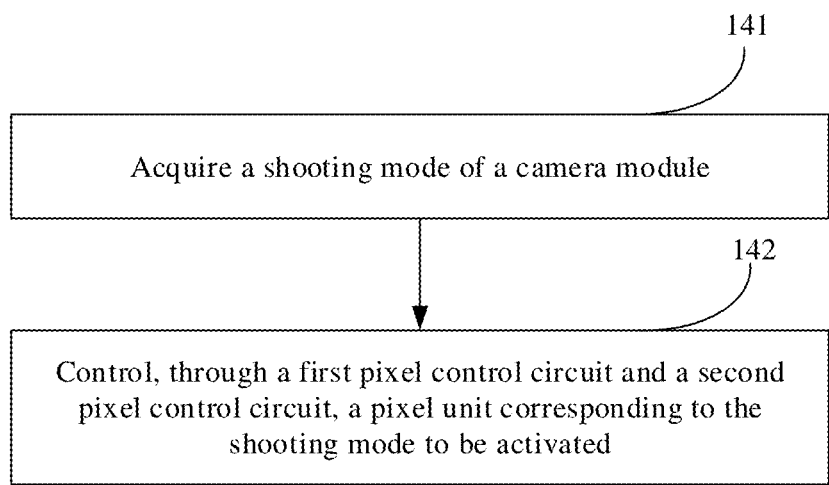
FIG. 14 is a schematic flowchart of a shooting method according to an embodiment of this application.

Based on the foregoing embodiments, optionally, as shown in FIG. 14, an embodiment of this application further provides a shooting method, where the method is applied to the electronic device as described above, and the method includes the following steps.

Step 141. Acquire a shooting mode.

Step 142. Control, through the first pixel control circuit and the second pixel control circuit, a pixel unit corresponding to the shooting mode to be activated.

Optionally, the controlling, through the first pixel control circuit and the second pixel control circuit, a pixel unit corresponding to the shooting mode to be activated includes:

in a case that the shooting mode is a first shooting mode, controlling, through the first pixel control circuit and the second pixel control circuit, both the first number of first pixel units and the second number of second pixel units to be activated;

in a case that the shooting mode is a second shooting mode, controlling, through the first pixel control circuit, the first number of first pixel units to be activated, and controlling, through the second pixel control circuit, the second number of second pixel units to be deactivated; and in a case that the shooting mode is a third shooting mode, controlling, through the second pixel control circuit, the second number of second pixel units to be activated, and controlling, through the first pixel control circuit, the first number of first pixel units to be deactivated.

In the shooting method provided in this embodiment of this application, working states of the first pixel units and the second pixel units in the pixel array are separately controlled to obtain better digital zoom effects and higher-quality images, and to reduce the number of camera modules to be provided on the same electronic device, thereby reducing costs.

Figure 15:
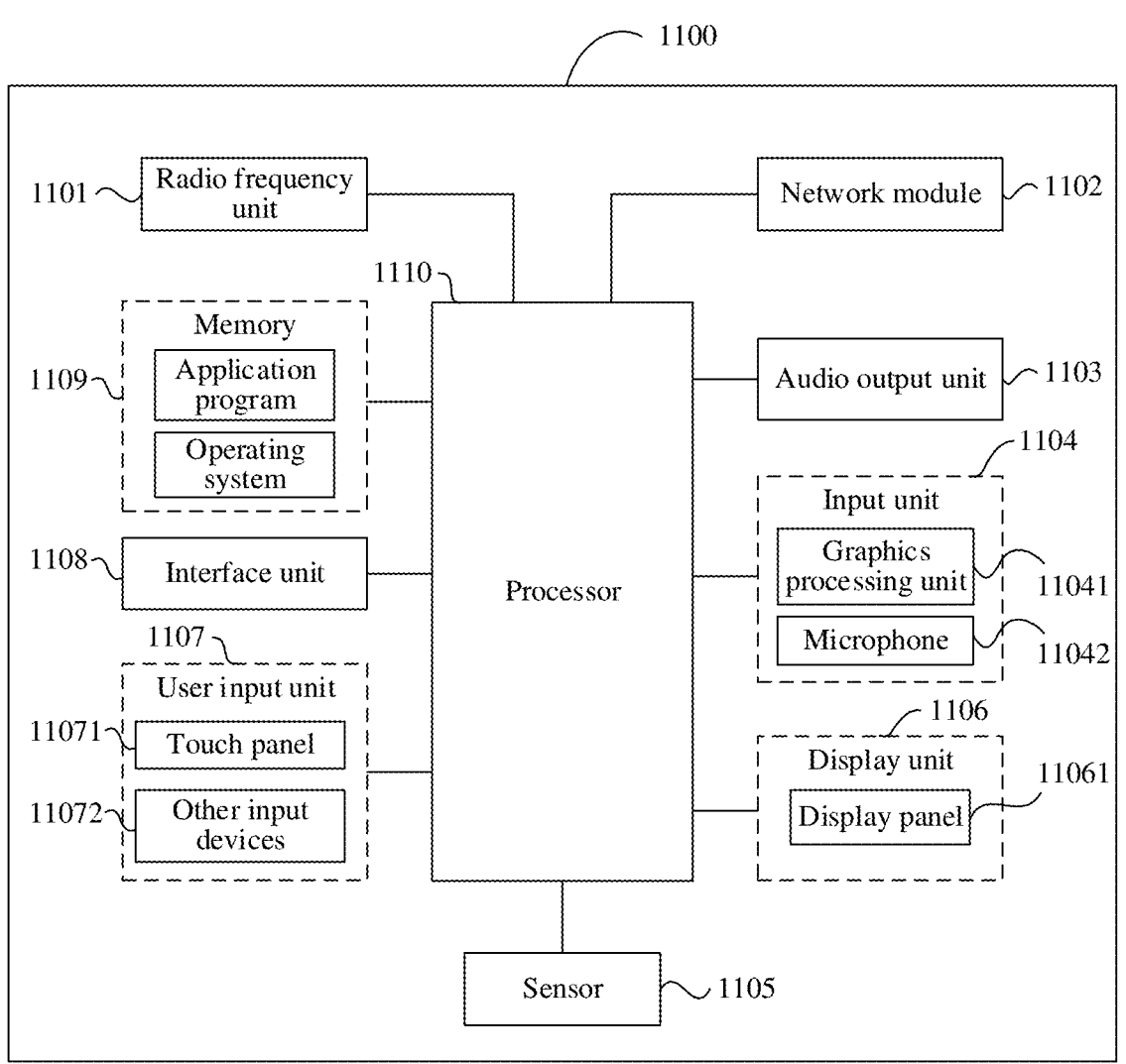
FIG. 15 is a schematic diagram of a hardware structure of an electronic device according to an embodiment of this application.

FIG. 15 is a schematic diagram of a hardware structure of an electronic device according to an embodiment of this application.

The electronic device 1100 includes but is not limited to components such as a radio frequency unit 1101, a network module 1102, an audio output unit 1103, an input unit 1104, a sensor 1105, a display unit 1106, a user input unit 1107, an interface unit 1108, a memory 1109, and a processor 1110.

Those skilled in the art can understand that the electronic device 1100 may further include a power supply (for example, a battery) that supplies power to various components. The power supply may be logically connected to the processor 1110 through a power management system, so that functions such as charge and discharge management and power consumption management are implemented by using the power management system. The structure of the electronic device shown in FIG. 15 does not constitute a limitation on the electronic device. The electronic device may include more or fewer components than shown in the figure, or some components may be combined, or there may be a different component layout. Details are not described herein again.

The processor 1110 is configured to acquire a shooting mode, and control, through the first pixel control circuit and the second pixel control circuit, a pixel unit corresponding to the shooting mode to be activated.

Optionally, the processor 1110 is configured to: in a case that the shooting mode is a first shooting mode, control, through the first pixel control circuit and the second pixel control circuit, both the first number of first pixel units and the second number of second pixel units to be activated;

in a case that the shooting mode is a second shooting mode, control, through the first pixel control circuit, the first number of first pixel units to be activated, and control, through the second pixel control circuit, the second number of second pixel units to be deactivated; and in a case that the shooting mode is a third shooting mode, control, through the second pixel control circuit, the second number of second pixel units to be activated, and control, through the first pixel control circuit, the first number of first pixel units to be deactivated.

In this way, the image sensor can be applicable to multiple shooting modes to obtain better digital zoom effects and higher-quality images.

It should be understood that in this embodiment of this application, the input unit 1104 may include a graphics processing unit (GPU) 11041 and a microphone 11042. The graphics processing unit 11041 processes image data of a static picture or a video that is obtained by an image capture apparatus, for example, a camera module, in a video capture mode or an image capture mode. The camera module includes an image sensor. The image sensor includes a pixel array, and the pixel array includes a first number of first pixel units and a second number of second pixel units, where the first pixel unit includes photosensitive elements stacked and configured to acquire photo signals of at least two colors, and the second pixel unit includes photosensitive elements configured to acquire photo signals of a single color. The display unit 1106 may include a display panel 11061. The display panel 11061 may be configured in a form of a liquid crystal display, an organic light-emitting diode display, or the like. The user input unit 1107 includes at least one of a touch panel 11071 or other input devices 11072. The touch panel 11071 is also referred to as a touchscreen. The touch panel 11071 may include two parts: a touch detection apparatus and a touch controller. The other input devices 11072 may include but are not limited to a physical keyboard, a function button (for example, a volume control button or a switch button), a trackball, a mouse, a joystick, and the like. Details are not described herein.

The memory 1109 may be configured to store software programs and various data. The memory 1109 may include first storage area for storing programs or instructions and a second storage area for storing data. The first storage area may store an operating system, an application program or instruction required by at least one function (for example, a sound playback function or an image playback function), and the like. In addition, the memory 1109 may include either a volatile memory or a non-volatile memory, or the memory 1109 may include both a volatile memory and a non-volatile memory. The non-volatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM), a static random access memory (SRAM), a dynamic random access memory (DRAM), a synchronous dynamic random access memory (SDRAM), a double data rate synchronous dynamic random access memory (DDRSDRAM), an enhanced synchronous dynamic random access memory (ESDRAM), a synchronous link dynamic random access memory (SLDRAM), and a direct rambus random access memory (DRRAM). The memory 1109 in this embodiment of this application includes but is not limited to these and any other suitable types of memories.

The processor 1110 may include one or more processing units. Optionally, an application processor and a modem processor are integrated in the processor 1110. The application processor primarily processes operations relating to an operating system, user interfaces, application programs, and the like. The modem processor primarily processes radio communication signals, for example, being a baseband processor. It can be understood that the modem processor may alternatively be not integrated in the processor 1110.

In the description of this specification, descriptions referring to the terms "an embodiment", "some embodiments", "exemplary embodiments", "an example", or "some examples" mean the features, structures, materials or characteristics described with to the embodiment or example are included in at least one embodiment or example of the this application. In this specification, illustrative expressions of these terms do not necessarily refer to the same embodiment or example. Moreover, the feature, structure, material, or characteristic described may be combined in any suitable manner in any one or more embodiments or examples.

Although the embodiments of this application have been shown and described, those of ordinary skill in the art can understand that various changes, modifications, substitutions, and variants of these embodiments may be made without departing from the principles and purposes of this application, and the scope of this application is limited by the claims and their equivalents.

What is claimed is:

1. An image sensor, wherein the image sensor comprises a pixel array, and the pixel array comprises a first number of first pixel units and a second number of second pixel units, wherein the first pixel unit comprises photosensitive elements stacked and configured to acquire photo signals of at least two colors, and the second pixel unit comprises photosensitive elements configured to acquire photo signals of a single color;
    wherein the second number of second pixel units comprise a red pixel unit, a green pixel unit, and a blue pixel unit.

2. The image sensor according to claim 1, wherein the first number of first pixel units are arranged in a central region of the pixel array and the second number of second pixel units are arranged in an edge region of the pixel array.

3. The image sensor according to claim 1, wherein the first number of first pixel units are arranged in a central region and four edge sub-regions in an edge region of the pixel array, and the second number of second pixel units are arranged in a predetermined sub-region in the edge region, wherein the predetermined sub-region is a region in the edge region other than the four edge sub-regions.

4. The image sensor according to claim 1, wherein the first number of first pixel units are arranged in an edge region of the pixel array and the second number of second pixel units are arranged in a central region of the pixel array.

5. The image sensor according to claim 1, wherein the pixel array comprises multiple pixel groups arranged in a matrix, and the pixel group comprises at least one red pixel unit, at least one green pixel unit, at least one blue pixel unit, and one first pixel unit.

6. The image sensor according to claim 1, wherein the image sensor further comprises:
    a first pixel control circuit, wherein the first pixel control circuit is connected to the first pixel unit, and the first pixel control circuit is configured to control activation and deactivation of at least one of the first pixel units; and
    a second pixel control circuit, wherein the second pixel control circuit is connected to the second pixel unit, and the second pixel control circuit is configured to control activation and deactivation of at least one of the second pixel units.

7. The image sensor according to claim 1, wherein the first pixel unit comprises a first photosensitive element, a second photosensitive element, and a third photosensitive element that are stacked, the first photosensitive element being configured to acquire photo signals of a blue waveband, the second photosensitive element being configured to acquire photo signals of a green waveband, and the third photosensitive element being configured to acquire photo signals of a red waveband.

8. The image sensor according to claim 1, wherein a ratio of the first number to the second number is 1:1 to 3:1.

9. A camera module, comprising an image sensor, wherein the image sensor comprises a pixel array, and the pixel array comprises a first number of first pixel units and a second number of second pixel units, wherein the first pixel unit comprises photosensitive elements stacked and configured to acquire photo signals of at least two colors, and the second pixel unit comprises photosensitive elements configured to acquire photo signals of a single color;
    wherein the second number of second pixel units comprise a red pixel unit, a green pixel unit, and a blue pixel unit.

10. The camera module according to claim 9, wherein the first number of first pixel units are arranged in a central region of the pixel array and the second number of second pixel units are arranged in an edge region of the pixel array.

11. The camera module according to claim 9, wherein the first number of first pixel units are arranged in a central region and four edge sub-regions in an edge region of the pixel array, and the second number of second pixel units are arranged in a predetermined sub-region in the edge region, wherein the predetermined sub-region is a region in the edge region other than the four edge sub-regions.

12. The camera module according to claim 9, wherein the first number of first pixel units are arranged in an edge region of the pixel array and the second number of second pixel units are arranged in a central region of the pixel array.

13. The camera module according to claim 9, wherein the pixel array comprises multiple pixel groups arranged in a matrix, and the pixel group comprises at least one red pixel unit, at least one green pixel unit, at least one blue pixel unit, and one first pixel unit.

14. The camera module according to claim 9, wherein the image sensor further comprises:

a first pixel control circuit, wherein the first pixel control circuit is connected to the first pixel unit, and the first pixel control circuit is configured to control activation and deactivation of at least one of the first pixel units; and a second pixel control circuit, wherein the second pixel control circuit is connected to the second pixel unit, and the second pixel control circuit is configured to control activation and deactivation of at least one of the second pixel units.

15. The camera module according to claim 9, wherein the first pixel unit comprises a first photosensitive element, a second photosensitive element, and a third photosensitive element that are stacked, the first photosensitive element being configured to acquire photo signals of a blue waveband, the second photosensitive element being configured to acquire photo signals of a green waveband, and the third photosensitive element being configured to acquire photo signals of a red waveband.

16. The camera module according to claim 9, wherein a ratio of the first number to the second number is 1:1 to 3:1.

17. The camera module according to claim 9, wherein the camera module further comprises:

a circuit board, wherein the image sensor is electrically connected to the circuit board; and a lens, wherein the lens is arranged on a side of the image sensor away from the circuit board.

18. An electronic device, comprising a camera module comprising an image sensor, wherein the image sensor comprises a pixel array, and the pixel array comprises a first number of first pixel units and a second number of second pixel units, wherein the first pixel unit comprises photosensitive elements stacked and configured to acquire photo signals of at least two colors, and the second pixel unit comprises photosensitive elements configured to acquire photo signals of a single color;

wherein the second number of second pixel units comprise a red pixel unit, a green pixel unit, and a blue pixel unit.

19. The electronic device of claim 18, wherein the electronic device is configured to perform steps comprising:

acquiring a shooting mode; and controlling, through a first pixel control circuit and a second pixel control circuit, a pixel unit corresponding to the shooting mode to be activated.

20. The electronic device according to claim 19, wherein the electronic device is configured such that the controlling, through the first pixel control circuit and the second pixel control circuit, a pixel unit corresponding to the shooting mode to be activated comprises:

in a case that the shooting mode is a first shooting mode, controlling, through the first pixel control circuit and the second pixel control circuit, both the first number of first pixel units and the second number of second pixel units to be activated;

in a case that the shooting mode is a second shooting mode, controlling, through the first pixel control circuit, the first number of first pixel units to be activated, and controlling, through the second pixel control circuit, the second number of second pixel units to be deactivated; and in a case that the shooting mode is a third shooting mode, controlling, through the second pixel control circuit, the second number of second pixel units to be activated, and controlling, through the first pixel control circuit, the first number of first pixel units to be deactivated.

\* \* \* \* \*